(12) United States Patent
Keaveney et al.

(10) Patent No.: US 6,556,086 B2
(45) Date of Patent: Apr. 29, 2003

(54) FRACTIONAL-N SYNTHESIZER AND METHOD OF SYNCHRONIZATION OF THE OUTPUT PHASE

(75) Inventors: Michael F. Keaveney, Lisnagry County Limerick (IE); Colin Lyden, Baltimore (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 09/957,042

(22) Filed: Sep. 20, 2001

(65) Prior Publication Data

US 2002/0180539 A1 Dec. 5, 2002

Related U.S. Application Data

(60) Provisional application No. 60/294,773, filed on May 31, 2001.

(51) Int. Cl.[7] ................................................. H03L 7/00
(52) U.S. Cl. .................... 331/1 A; 331/25; 327/156; 455/260; 375/376
(58) Field of Search ................... 331/1 A, 25; 327/156; 455/260; 375/376

(56) References Cited

U.S. PATENT DOCUMENTS

6,249,685 B1 * 6/2001 Sharaf et al. ............... 327/148

* cited by examiner

Primary Examiner—Arnold Kinkead
(74) Attorney, Agent, or Firm—Iandiorio & Teska

(57) ABSTRACT

A fractional-N synthesizer and method of phase synchronizing the output signal with the input reference signal in a fractional-N synthesizer by generating a synchronization pulse at integer multiples of periods of the input reference signal and gating the synchronization pulse to re-initialize the interpolator in the fractional-N synthesizer to synchronize the phase of the output signal with the input reference signal.

10 Claims, 3 Drawing Sheets

FRACTIONAL-N SYNTHESIZER AND METHOD OF SYNCHRONIZATION OF THE OUTPUT PHASE

RELATED APPLICATIONS

This application claims priority of U.S. Provisional Application No. 60/294,773, filed on May 31, 2001, entitled FRACTIONAL-N SYNTHESIZER WITH SYNCHRONIZED OUTPUT PHASE.

FIELD OF THE INVENTION

This invention relates to a fractional-N synthesiser and method of synchronisation in which the output is phase-synchronised to the input reference divided by the fractional modulus.

BACKGROUND OF THE INVENTION

In a phase locked loop (PLL) the output signal is phase and frequency locked to an input reference signal. A PLL with a frequency divider inserted in the feedback loop can be used to make an Integer-N frequency synthesiser. In that case the signal at the phase detector negative input is phase and frequency locked to the reference. The output frequency and phase is N times the reference frequency and phase. Output frequencies can be synthesised in steps of the reference frequency by programming the value of N. There are exactly N periods of the output for every period of the reference and therefore one rising edge of the output in every N is in phase with each rising edge of the reference. For any given value of N the phase of the output relative to the reference is fixed and is the same each time the synthesiser is switched back to that frequency channel. In a fractional-N synthesiser, the divider in the feedback path has an integer and fractional part and the output frequency step resolution is a fraction of the reference frequency, as shown in equation 1:

$$f_{OUT} = \left(N + \frac{F}{M}\right) \times f_{REF} \quad (1)$$

The fractional part is generated using a digital interpolator. This outputs a sequence of integer values with an average value given by F/M where F is the input fraction and M is the modulus. The modulus M can be programmable also or it may be fixed for a given implementation.

The interpolator could be for instance, a single accumulator with the overflow bit as output or it could be a higher order sigma-delta modulator. There are numerous prior art examples of both architectures.

Fractional-N synthesisers have a number of advantages which make them desirable. Their output steps are in fractions of the reference frequency. This allows the use of larger input reference frequencies which in turn allows N to be smaller. This is a major advantage because phase noise gain from input to output is a function of $N^2$ or 20 Log N in dB's so the noise can be much reduced by even a small reduction in N. Also the availability of a larger reference frequency allows a wider loop bandwidth which in turn allows a shorter settling time each time the synthesiser is switched from one frequency channel to another.

By rewriting equation (1) as follows:

$$f_{OUT} = (MN + F) \times \frac{f_{REF}}{M} \quad (2)$$

it is clear that the output will only be in phase with one out of every M edges of the input reference. This highlights a major disadvantage of fractional-N synthesisers in that the output phase can have any one of M possible values with respect to the input reference phase, where M is the fractional modulus. Which one of the M edges of the reference this will be may be different each time the channel is synthesised depending on the particular state of the interpolator when the new N and F values, which specify the channel to be synthesised, are loaded. In some applications this doesn't matter but when it is required that a particular output frequency signal has consistently the same phase relationship with a reference then this is a problem with a fractional-N synthesiser.

SUMMARY OF THE INVENTION

It is a primary object of this invention to provide a fractional-N synthesiser and method of synchronisation of the output phase with respect to a reference phase.

This invention results from the realization that a truly simple and effective fractional-N synthesiser with the output signal phase synchronised with the input reference signal can be achieved by generating a synchronisation pulse at integer multiples of periods of the input reference signal and gating one of those synchronisation pulses to re-initialise the interpolator in the fractional-N synthesiser to synchronise the phase of the output signal with the input reference signal.

This invention features a fractional-N synthesiser with synchronised output phase including a phased locked loop having an output signal whose frequency is a fractional multiple of the input reference signal. The phase locked loop includes a frequency divider. There is a synchronisation counter responsive to the input reference signal for generating synchronisation pulses at integer multiples of M periods of the input reference signal. An interpolator is responsive to an input fraction to provide to the frequency divider an output which has a fractional value equal to, on average, the input fraction. A gating circuit responsive to an enable signal passes a synchronisation pulse to re-initialise the interpolator to phase synchronise the output signal with the input reference signal.

In a preferred embodiment the frequency divider may include a dual modulus divider having moduli N and N+1. The frequency divider may alternatively include a programmable divider circuit and a summing circuit responsive to the interpolator output and an integer input. The gating circuit may pass the second or later synchronisation pulse after the occurrence of the enabled signal. The interpolator may be a modulo M interpolator.

This invention also features a method of phase synchronising the output signal with the input reference signal in a fractional-N synthesiser including generating a synchronisation pulse at integer multiples of periods of the input reference signal and gating a synchronisation pulse to re-initialise the interpolator in the fractional synthesiser to synchronise the phase of the output signal with the input reference signal.

In a preferred embodiment the synchronisation pulses may be generated at integer multiples of M periods where M is the modulus of the interpolator. The gating of the synchronisation pulse to re-initialise the interpolator may be enabled by a predetermined change in the frequency of the output signal.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
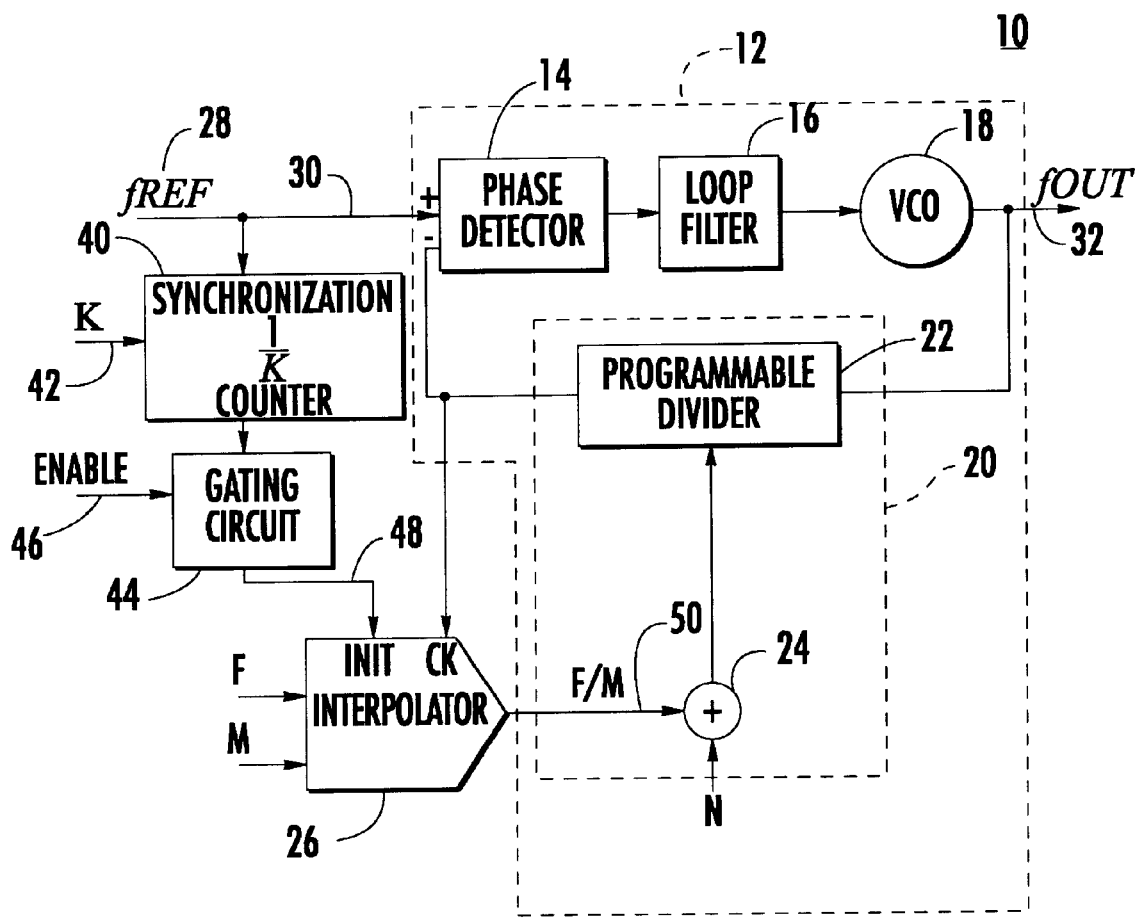
FIG. 1 is a schematic block diagram of a fractional-N synthesiser in which the output is phase synchronised to the input reference according to this invention.

There is shown in FIG. 1, a fractional-N synthesiser 10 with synchronised output phase. Synthesiser 10 includes a phase locked loop (PLL) 12 including a phase detector 14, loop filter 16, voltage controlled oscillator (VCO) 18, and a frequency divider 20 which includes in FIG. 1, a programmable divider 22 and summing circuit 24. Interpolator 26 provides to summing circuit 24 the fractional input F/M where F is typically the numerator of the fraction and M is the denominator or modulus. The integer portion N can be provided from an external source; the two are combined in summing circuit 24 to provide the divisor number to program divider 22.

In operation a reference frequency 28 ($f_{REF}$) is delivered at input 30 to the positive input of phase detector 14. Voltage controlled oscillator 18 provides an output signal $f_{OUT}$ on line 32, the frequency of which is a function of the voltage supplied to VCO 18. The frequency of the output signal on line 32 is divided by the divisor in programmable divider 22 and delivered back to the negative input of phase detector 14. Any difference in the phase of the two signals is detected by phase detector 14 and a signal representative thereof is provided to loop filter 16. Loop filter 16 integrates or averages the signal and provides a voltage to VCO 18 to increase or decrease the frequency of the output signal $f_{OUT}$ on line 32 until the inputs to phase detector 14 are balanced.

Each time phase locked loop 12 is switched to a different channel, that is, the frequency of its output, $f_{OUT}$, is changed by changing any one or more of the parameters F, M, N, the balancing process starts anew. However in fractional-N synthesisers the higher frequency output signal $f_{OUT}$ is only in phase with the input reference frequency 28 every M periods of the reference signal. More importantly the output will only be in phase with one of the M edges of the reference and which one of the M edges of the references it will be may be different each time the channel is switched or synthesised depending upon the particular state of the interpolator.

In accordance with this invention the output frequency, $f_{OUT}$, can be reliably phase locked to the input reference frequency, $f_{REF}$, by using a synchronisation counter 40 which is responsive to the input reference frequency $f_{REF}$ (which does not change) to produce a synchronisation pulse one out of every K times. K is a factor that may be programmable and introduced on line 42 or may be permanently stored in counter 40. K is equal to n×M where n is a whole number e.g. 1, 2, 3 etc. These synchronisation pulses are only passed by gating circuit 44 to interpolator 26 when an enable signal has been provided on line 46. Such an enable signal can be generated as a result, for example, of any change in the values F, M or N. Thus when gating circuit 44 is enabled it passes a synchronisation pulse from counter 40 on line 48 to the initialising input of interpolator 26. This sets interpolator 26 to its initial state at which it is known that the input reference frequency 28 and output frequency 32 are in a given phase and they will then continue to be in phase every M cycles. Interpolator 26 may be a simple adder circuit with a carry out where the carry appears on line 50 as the fractional input to summer 24 or it may be a higher order sigma delta modulator for example. The initialisation of interpolator 26 may reset it to zero or may set it to any other predetermined setting for example as may be used to randomise the output on line 50 to minimise noise.

Figure 2:
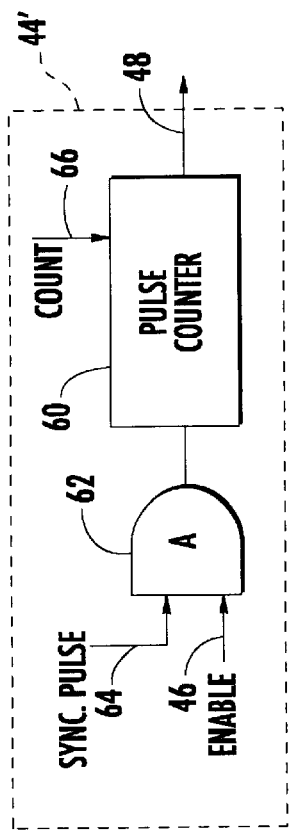
FIG. 2 is a schematic diagram of one implementation of the gating circuit of FIG. 1.

Although as shown in FIG. 1, gating circuit 44 will pass the first synchronisation pulse from counter 40 after gating circuit 44 has been enabled by a signal on line 46, this is not a necessary limitation of the invention. For example, gating circuit 44 may be implemented as shown at 44, FIG. 2, using a pulse counter 60 and AND gate 62. AND gate 62 receives sync pulses from synchronisation counter 40 at one input and the enable on line 46 at its other input. The sync pulses are presented continuously but are only passed by AND gate 62 when the enable signal is present on line 46. If pulse counter 60 is set to a count of one by a signal on line 66 then the first synchronisation pulse occurring after the appearance of the enable signal is passed out on line 48 to the initialising input of interpolator 26. But pulse counter 60 may be programmed on line 66 with any other number, for example, 2, in which case only the second synchronisation pulse after the enabled signal occurs would be passed out on line 48. This can be done to ensure that ample time has been given for the settling of the system after the channel has been changed after a change in the output frequency $f_{OUT}$ such as by a change in F, M or N, for example.

Figure 3:
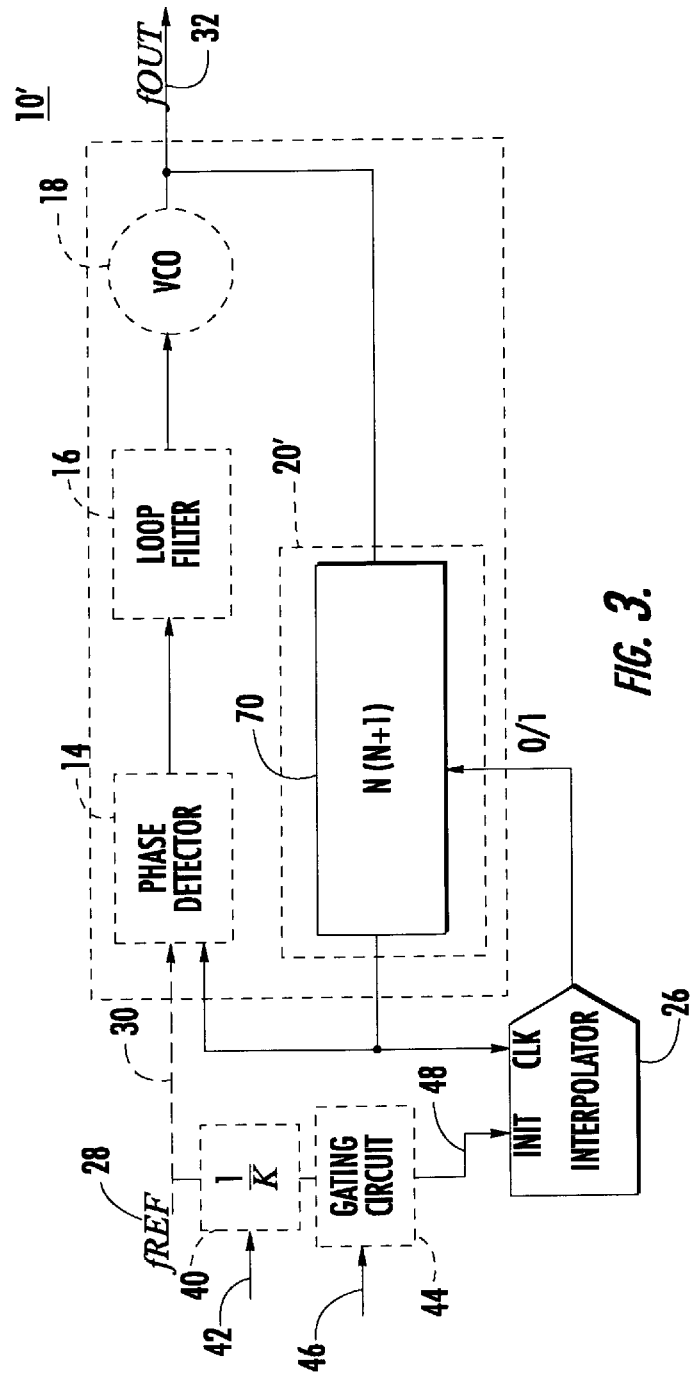
FIG. 3 is a schematic diagram of another implementation of the frequency divider of FIG. 1.

While the frequency divider 20 FIG. 1, is shown as including a programmable divider 22 and a summing circuit 24 for combining the integer N and fraction F/M, this is not a necessary limitation of the invention. For example, as shown in FIG. 3, frequency divider 20' may include simply a dual modulus divider or dual divisor divider 70 which uses the moduli N and N+1, for example. The input from interpolator 26 is simply 0 or 1.

Figure 4:
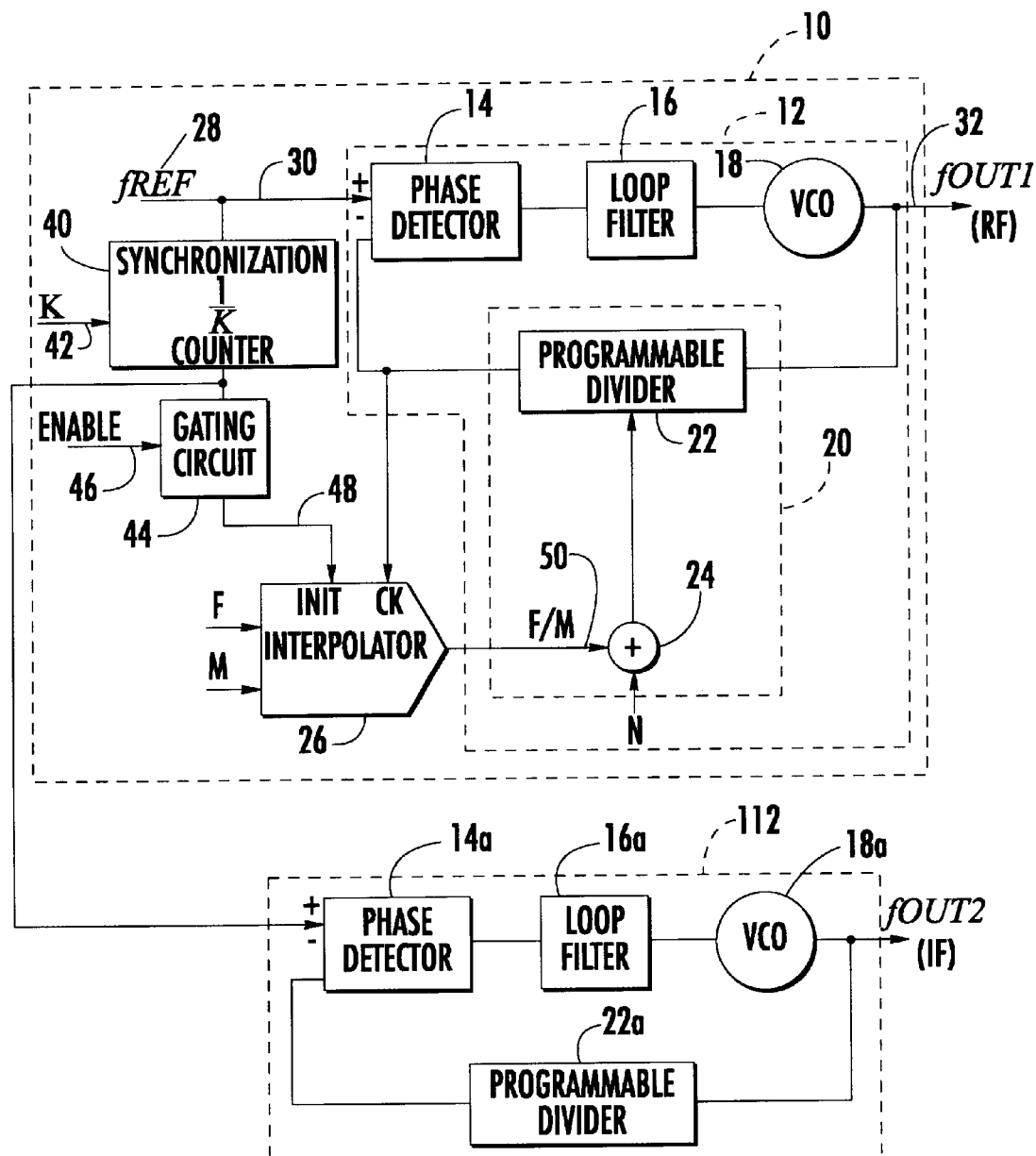
FIG. 4 is a schematic block diagram of the fractional-N synthesiser of FIG. 1, with an integer N synthesiser.

In one application, FIG. 4, the invention may be applied in a fractional-N synthesiser with synchronised output phase and integer-N synthesiser. There PLL 12 generates an $f_{OUT}$ signal which may be for example an RF signal and a second PLL 112 generates a second $f_{OUT}$ signal which may be an IF signal for use in a superheterodyne circuit. The input to phase detector 14a comes from synchronisation counter 40.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A fractional-N synthesizer with synchronised output phase comprising:
   a phase locked loop having an output signal whose frequency is a fractional multiple of the input reference frequency; said phase locked loop including a frequency divider;
   a synchronisation counter responsive to said input reference signal for generating synchronisation pulses at integer multiples of M periods of the input reference signal;
   an interpolator responsive to an input fraction to provide to said frequency divider an output which has a fractional value equal to on average, said input fraction; and
   a gating circuit responsive to an enable signal to pass at least one of said synchronisation pulses to re-initialise said interpolator to phase synchronise said output signal with respect to the input reference signal.

2. The fractional-N synthesiser of claim 1 in which said frequency divider includes a dual modulus divider having moduli N and N+1.

3. The fractional-N synthesiser of claim 1 in which said frequency divider includes a programmable divider circuit and a summing circuit responsive to said interpolator output and an integer input.

4. The fractional-N synthesiser of claim 1 in which said gating circuit passes the second or later synchronisation pulse after the occurrence of the enable signal.

5. The fractional-N synthesiser of claim 1 in which said interpolator is a modulo M interpolator.

6. A method of phase synchronising the output signal with the input reference signal in a fractional-N synthesiser having an interpolator, comprising:
   generating a synchronisation pulse at integer multiples of periods of the input reference signal; and
   gating said synchronisation pulse to re-initialise the interpolator in the fractional-N synthesiser to synchronise the phase of the output signal with the input reference signal.

7. The method of claim 6 in which said synchronisation pulses are generated at integer multiples of M periods where M is the modulus of the interpolator.

8. The method of claim 6 in which said gating of a synchronisation pulse to re-initialise the interpolator is enabled by a predetermined change in the frequency of the output signal.

9. A fractional synthesiser with synchronised output phase comprising:
   a phase locked loop having an output signal whose frequency is a fractional multiple of the input reference frequency; said phase locked loop including a frequency divider;
   a synchronisation counter responsive to said input reference signal for generating synchronisation pulses at integer multiples of M periods of the input reference signal;
   an interpolator responsive to an input fraction to provide to said frequency divider an output which has a fractional value equal to on average, said input fraction;
   a gating circuit responsive to an enable signal to pass at least one of said synchronisation pulses to re-initialise said interpolator to phase synchronise said output signal with respect to the input reference signal; and
   a programmable divider circuit and a summing circuit responsive to said interpolator output and an integer input.

10. A fractional synthesiser with synchronised output phase comprising;
    a phase locked loop having an output signal whose frequency is a fractional multiple of the input reference frequency; said phase locked loop including a frequency divider;
    a synchronisation counter responsive to said input reference signal for generating synchronisation pulses at integer multiples of M periods of the input reference signal;
    an interpolator responsive to an input fraction to provide to said frequency divider an output which has a fractional value equal to on average, said input fraction;
    a gating circuit responsive to an enable signal to pass at least one of said synchronisation pulses to re-initialise said interpolator to phase synchronise said output signal with respect to the input reference signal; and
    said gating circuit passes the second or later synchronisation pulse after the occurrence of the enable signal.

* * * * *